(12) United States Patent
Zhang et al.

(10) Patent No.: US 11,800,662 B2
(45) Date of Patent: Oct. 24, 2023

(54) DEFORMABLE DISPLAY DEVICE AND DEFORMATION CONTROL METHOD THEREFOR

(71) Applicant: Shanghai Tianma Micro-Electronics Co., Ltd., Shanghai (CN)

(72) Inventors: Xiaoyin Zhang, Shanghai (CN); Ping An, Shanghai (CN)

(73) Assignee: Shanghai Tianma Micro-Electronics Co., Ltd., Shanghai (CN)

(*) Notice: Subject to any disclaimer, the term of this patent is extended or adjusted under 35 U.S.C. 154(b) by 36 days.

(21) Appl. No.: 17/556,851

(22) Filed: Dec. 20, 2021

(65) Prior Publication Data

US 2022/0117102 A1    Apr. 14, 2022

(30) Foreign Application Priority Data

Aug. 11, 2021    (CN) .......................... 202110917114.2

(51) Int. Cl.
   *H05K 5/02*        (2006.01)
   *H05K 5/00*        (2006.01)
   *G06F 1/16*        (2006.01)

(52) U.S. Cl.
   CPC ......... *H05K 5/0217* (2013.01); *G06F 1/1652* (2013.01); *H05K 5/0017* (2013.01)

(58) Field of Classification Search
   CPC ........................... H05K 5/0217; G06F 1/1652
   See application file for complete search history.

(56) References Cited

U.S. PATENT DOCUMENTS

| | | | | |
|---|---|---|---|---|
| 9,116,662 | B1* | 8/2015 | Song | G06F 1/1601 |
| 10,484,642 | B2* | 11/2019 | Park | G09G 3/3216 |
| 11,659,672 | B2* | 5/2023 | Cho | H05K 5/0226 |
| | | | | 361/807 |

(Continued)

FOREIGN PATENT DOCUMENTS

| | | |
|---|---|---|
| CN | 207992616 U | 10/2018 |
| CN | 208487385 U | 2/2019 |

OTHER PUBLICATIONS

English translation of CN208487385U (Year: 2023).*

(Continued)

*Primary Examiner* — Sagar Shrestha
(74) *Attorney, Agent, or Firm* — CHRISTENSEN O'CONNOR JOHNSON KINDNESS PLLC

(57) ABSTRACT

A deformable display device and a deformation control method therefor are provided. The deformable display device includes a flexible display screen and a deformation control structure configured to drive the flexible display screen to deform. The deformable display device has a first mode and a second mode. A first distance between a first point of the flexible display screen and a reference point in the first mode is not equal to a second distance between the first point and the reference point in the second mode. The reference point is a point on the deformation control structure. A position of the reference point remains unchanged when the deformable display device is switched from the first mode to the second mode. A display surface, on which the first point is located, of the flexible display screen intersects a line connecting the first point with the reference point.

19 Claims, 14 Drawing Sheets

(56) References Cited

U.S. PATENT DOCUMENTS

| | | | |
|---|---|---|---|
| 2014/0198465 A1* | 7/2014 | Park | G09F 9/00 |
| | | | 361/749 |
| 2014/0376163 A1* | 12/2014 | Song | G09F 9/301 |
| | | | 361/679.01 |
| 2015/0145755 A1* | 5/2015 | Yamazaki | G09G 3/03 |
| | | | 361/679.01 |
| 2016/0035310 A1* | 2/2016 | Song | G06F 3/017 |
| | | | 345/156 |
| 2016/0127674 A1* | 5/2016 | Kim | H04N 21/42204 |
| | | | 348/739 |
| 2020/0409418 A1* | 12/2020 | Yoo | G06F 1/1675 |
| 2022/0147103 A1* | 5/2022 | Cheng | G06F 1/1681 |

OTHER PUBLICATIONS

Chinese Office Action dated Dec. 12, 2022, issued in related Chinese Application No. 202110917114.2 filed Aug. 11, 2021, 11 pages.

* cited by examiner

DEFORMABLE DISPLAY DEVICE AND DEFORMATION CONTROL METHOD THEREFOR

CROSS-REFERENCE TO RELATED APPLICATIONS

The present application claims priority to Chinese Patent Application No. 202110917114.2, filed on Aug. 11, 2021, the content of which is incorporated herein by reference in its entirety.

TECHNICAL FIELD

The present disclosure relates to the field of display technology, in particular to a deformable display device and a deformation control method for the deformable display device.

BACKGROUND

Flexible display technology is a main development trend in the current display technology. Flexible display devices have characteristics such as bendability and low power consumption, and thus are widely used in small-screen display devices such as mobile phones and computers, as well as outdoor large-screen display devices.

When the conventional flexible display device are deformed to display images, a simple curved display with a local deformation utilizing its own flexibility is adopted. Such type of deformation may not meet the demands of multiple viewing angles, especially in application scenarios of outdoor and other large-screen displays, resulting in poor viewing experience.

SUMMARY

In a first aspect of the present disclosure, a deformable display device is provided. The deformable display device includes a flexible display screen and a deformation control structure configured to drive the flexible display screen to deform. The deformable display device has a first mode and a second mode. A first distance between a first point of the flexible display screen and a reference point in the first mode is not equal to a second distance between the first point and the reference point in the second mode. The reference point is a point on the deformation control structure. A position of the reference point remains unchanged when the deformable display device is switched from the first mode to the second mode. A display surface, on which the first point is located, of the flexible display screen intersects a line connecting the first point with the reference point.

In a second aspect of the present disclosure, a deformation control method for a deformable display device is provided and applied to the above deformable display device. The deformation control method includes: in the first mode, controlling, by the deformation control structure, a distance between the first point of the flexible display screen and the reference point to be the first distance; and in the second mode, controlling, by the deformation control structure, the distance between the first point of the flexible display screen and the reference point to be the second distance not equal to the first distance. The reference point is a point on the deformation control structure. A position of the reference point remains unchanged when the deformable display device is switched from the first mode to the second mode. A display surface, on which the first point is located, of the flexible display screen intersects a line connecting the first point with the reference point.

BRIEF DESCRIPTION OF DRAWINGS

In order to more clearly explain the embodiments of the present disclosure, the drawings used in the description of the embodiments or the related art will be briefly described below. The drawings in the following description are some embodiments of the present disclosure. Those skilled in the art can obtain other drawings based on these drawings.

DESCRIPTION OF EMBODIMENTS

In order to better understand the technical solutions of the present disclosure, embodiments of the present disclosure will be described in detail below with reference to the accompanying drawings.

It should be clear that the described embodiments are only some of the embodiments of the present disclosure, rather than all of the embodiments. Based on the embodiments of the present disclosure, all other embodiments obtained by those of ordinary skill in the art shall fall within the protection scope of the present disclosure.

The terms used in the embodiments of the present disclosure are merely for the purpose of describing specific embodiment, rather than limiting the present disclosure. The terms "a", "an", "the" and "said" in a singular form in the embodiments of the present disclosure and the attached claims are also intended to include plural forms thereof, unless noted otherwise.

It should be understood that the term "and/or" used in the context of the present disclosure is to describe a correlation relation of related objects, indicating that there can be three relations, e.g., A and/or B can indicate A alone, both A and B, and B alone. In addition, the symbol "I" in the context generally indicates that the relation between the objects in front and at the back of "/" is an "or" relationship.

It should be understood that although the terms "first" and "second" can be used in the embodiments of the present disclosure to describe structures such as positioning posts, positioning holes, etc., these positioning posts, positioning holes and other structures should not be limited to these terms. These terms are only used to distinguished structures (such as positioning posts and positioning holes) from each other. For example, without departing from the scope of embodiments of the present disclosure, the first positioning post can also be referred to as the second positioning post, and similarly, the second positioning post can also be referred to as the first positioning post.

Depending on the context, the word "if" used herein can be interpreted as "under the condition" or "when" or "in response to determination" or "in response to detection". Similarly, depending on the context, the phrase "if determined" or "if detected (statement or event)" can be interpreted as "when determining" or "in response to determining" or "when detecting (statement or event)" or "in response to detecting (statement or event)".

Figure 1:
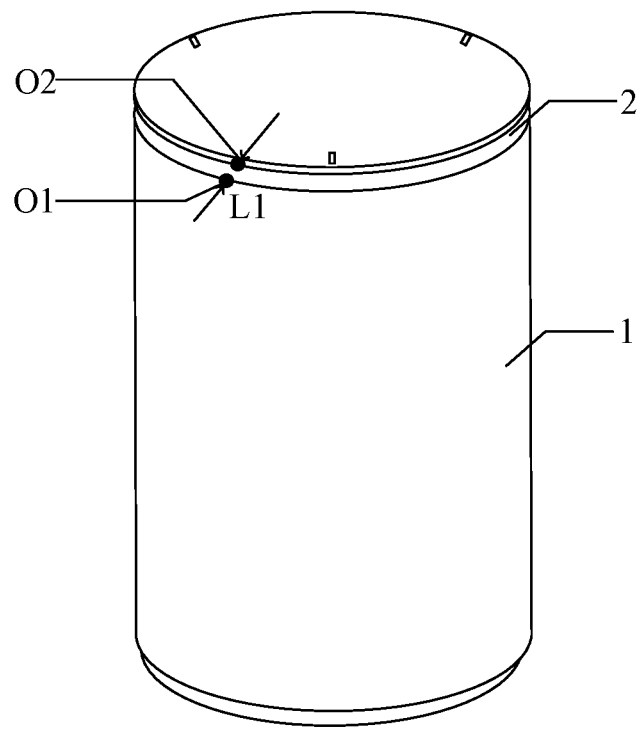
FIG. 1 is a schematic diagram of a deformable display device in a first mode according to an embodiment of the present disclosure.
Figure 2:
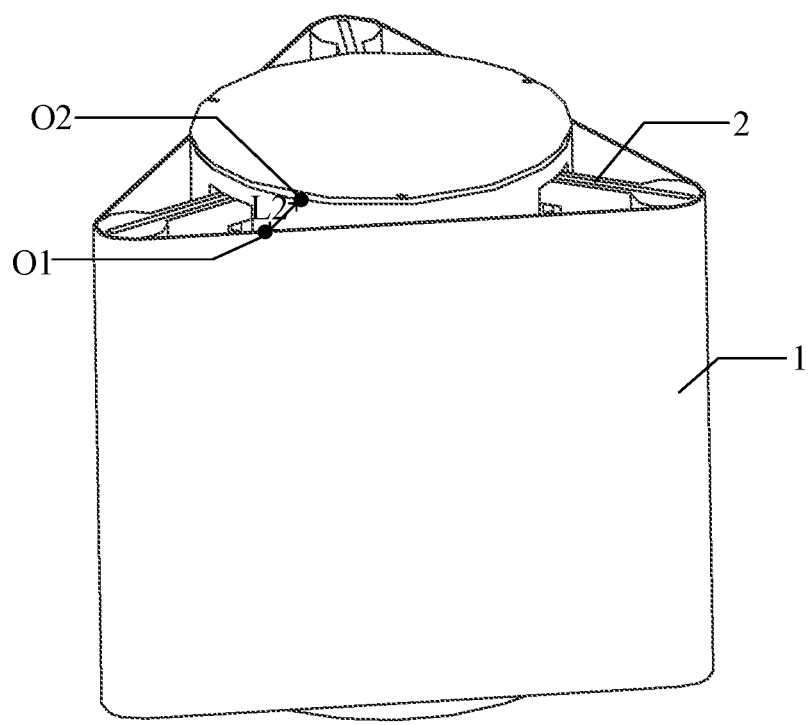
FIG. 2 is a schematic diagram of a deformable display device in a second mode according to an embodiment of the present disclosure.

An embodiment of the present disclosure provides a deformable display device. FIG. 1 is a schematic diagram of the deformable display device in a first mode according to an embodiment of the present disclosure, and FIG. 2 is a schematic diagram of the deformable display device in a second mode according to an embodiment of the present disclosure. As shown in FIG. 1 and FIG. 2, the deformable display device includes a flexible display screen 1 and a deformation control structure 2 configured to drive the flexible display screen 1 to deform.

The deformable display device has a first mode and a second mode. With reference to FIG. 1, in the first mode, a distance between a first point O1 of the flexible display screen 1 and a reference point O2 is a first distance L1. With reference to FIG. 2, in the second mode, the distance between the first point O1 and the reference point O2 is a second distance L2 which is not equal to the first distance. The reference point O2 is a point on the deformation control structure 2. When the deformable display device is switched from the first mode to the second mode, a position of the reference point O2 remains unchanged, a display surface, on which the first point O1 is located, of the flexible display screen 1 intersects a line connecting the first point O1 with the reference point O2.

Taking shapes of the flexible display screen 1 shown in FIG. 1 and FIG. 2 as an example, in the first mode, the flexible display screen 1 is a three-dimensional annular screen, and the display surface, on which the first point O1 is located, of the flexible display screen 1 is a curved surface. The display surface intersects the line connecting the first point O1 with the reference point O2. When switching the first mode to the second mode, the flexible display screen 1 is switched to a three-dimensional triangular screen, and the display surface of the flexible display screen 1 where the first point O1 is located is switched from a curved surface to a flat surface. The switched display surface also intersects the line connecting the first point O1 with the reference point O2. It should be noted that when the flexible display screen 1 is switched between different shapes, for example, switching from a three-dimensional annular screen to a three-dimensional triangular screen, the display surface where the first point O1 is located in the first mode can intersect with the display surface of the flexible display screen 1 where the first point O1 is in the second mode.

In embodiments of the present disclosure, the first distance between the first point O1 and the reference point O2 in the first mode is not zero, and the second distance between the first point O1 and the reference point O2 in the second mode is not zero. For example, when the reference point O2 is selected inside the deformation control structure 2, such as a point on a central axis of the deformation control structure 2, regardless of the shape of the flexible display screen 1, the first point O1 on the flexible display screen 1 is separated from the reference point O2 with a certain distance. At this time, the first distance and the second distance are not zero. It is appreciated that, when the reference point O2 is selected at a certain position, the first distance between the first point O1 and the reference point O2 in the first mode can be zero, or the first point O1 and the reference point O2 in the second mode can be zero. For example, in the first mode, at least a part of the flexible display screen 1 is in contact with the deformation control structure 2. When the reference point O2 is located on a side wall of the deformation control structure 2 that is in contact with the flexible display screen 1 and the first point O1 is located on the display surface of the flexible display screen 1 that is in contact with the deformation control structure 2, the first distance between the first point O1 and the reference point O2 can be zero. At this time, the first point O1 and the reference point O2 can be regarded as a same point.

In embodiments of the present disclosure, the deformation control structure 2 drives the flexible display screen 1 to change the distance between the first point O1 and the reference point O2, which enable the flexible display screen 1 to switch between different shapes. For example, the deformation control structure 2 can drive the flexible display screen 1 to switch from the three-dimensional annular screen shown in FIG. 1 to the three-dimensional triangular screen shown in FIG. 2. In this way, the deformation of the flexible display screen 1 is no longer limited to the shapes that can be realized by utilizing only its own bending and folding, but the flexible display screen 1 can have a variety of deformations under the control of the deformation control structure 2, and the deformed screen shape can satisfy larger viewing angle requirements, such as meeting a requirement of an viewing angle of 360°, which enables the deformable display device to be applied to more application scenarios and thus bring a better viewing experience to viewers.

Figure 3:
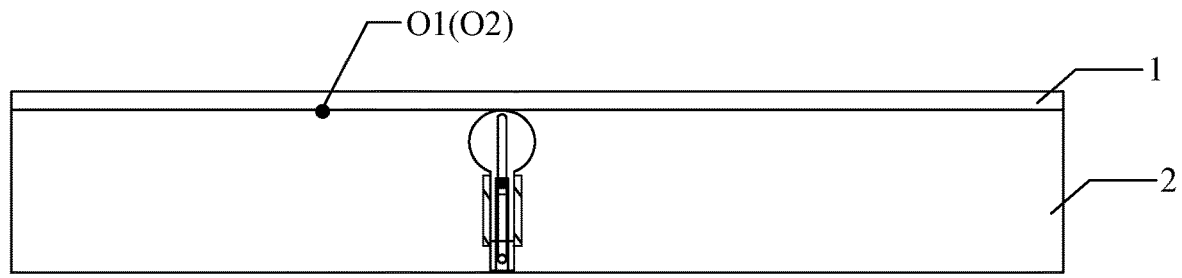
FIG. 3 is another schematic diagram of a deformable display device in a first mode according to an embodiment of the present disclosure.
Figure 4:
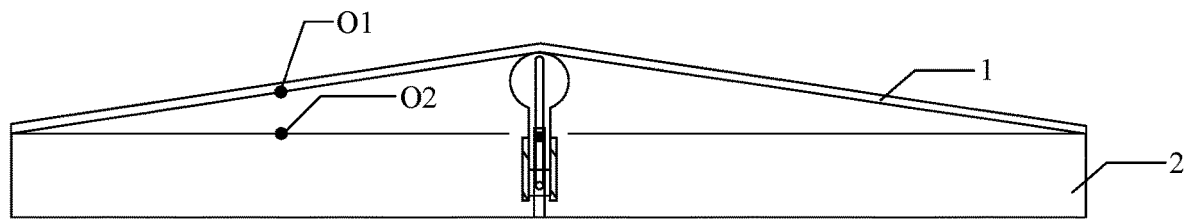
FIG. 4 is another schematic diagram of a deformable display device in a second mode according to an embodiment of the present disclosure.

The deformation control structure 2 provided by an embodiment of the present disclosure can drive the screen of the flexible display screen 1 to switch between a variety of stereoscopic (three-dimensional) shapes, and can also drive the screen of the flexible display screen 1 to switch between a planar (two-dimensional) state and a stereoscopic state. For example, in an embodiment, with reference to FIG. 1 and FIG. 2, under the control of the deformation control structure 2, the flexible display screen 1 can switch from a three-dimensional annular screen to a three-dimensional triangular screen. FIG. 3 is another schematic diagram of a deformable display device in a first mode provided by an embodiment of the present disclosure, and FIG. 4 is another schematic diagram of a deformable display device in a second mode provided by an embodiment of the present disclosure. In another embodiment, as shown in FIG. 3 and FIG. 4, under the control of the deformation control structure 2, the flexible display screen 1 can switch from a flat screen to a three-dimensional cone screen, which can make the deformation of the screen more diversified and thus make the screen be suitable for more scenarios.

Figure 5:
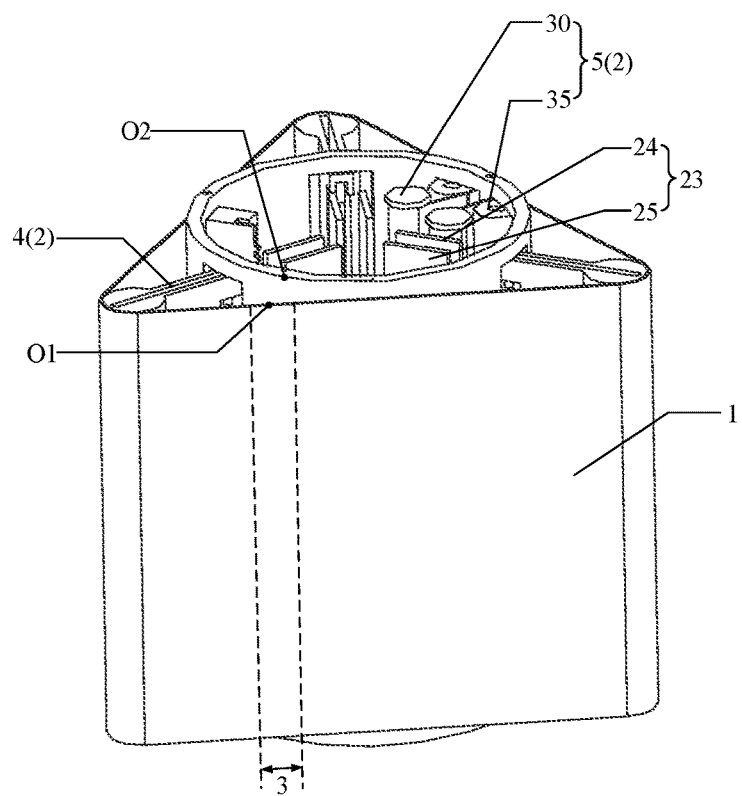
FIG. 5 is a schematic diagram of a deformation control structure according to an embodiment of the present disclosure.

FIG. 5 is a schematic diagram of a deformation control structure according to an embodiment of the present disclosure. As shown in FIG. 5, the flexible display screen 1 includes a first region 3, and the first point O1 is located in the first region 3. The deformation control structure 2 includes a moving portion 4 and a rolling control portion 5. When the deformable display device is switched from the first mode to the second mode, the moving portion 4 drives the first region 3 of the flexible display screen 1 to move relative to the reference point O2, and the rolling control portion 5 controls the flexible display screen 1 to wind or unwind.

Figure 6:
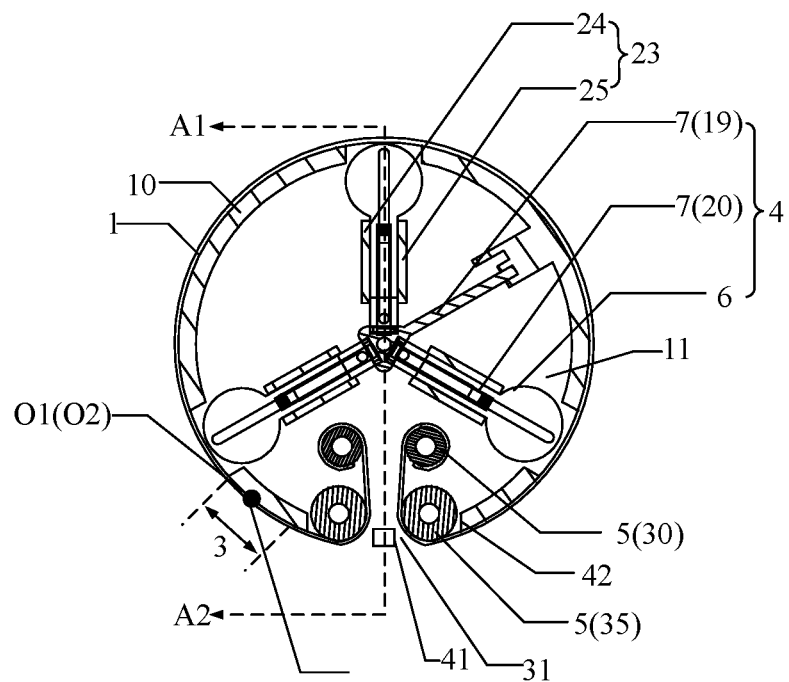
FIG. 6 is a top view of a deformation control structure in a first mode according to an embodiment of the present disclosure.
Figure 7:
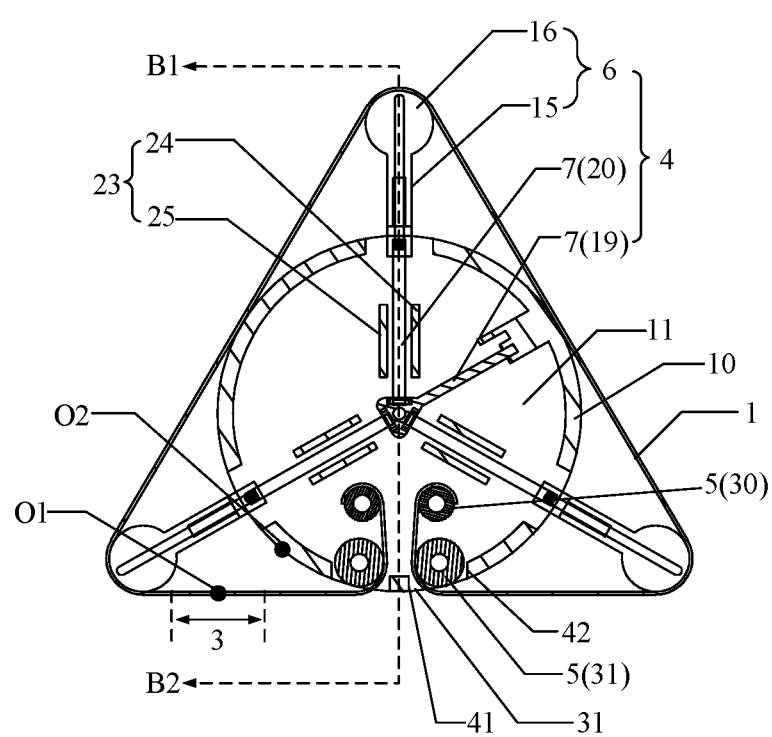
FIG. 7 is a top view of a deformation control structure in a second mode according to an embodiment of the present disclosure.

FIG. 6 is a top view of a deformation control structure in a first mode according to an embodiment of the present disclosure, and FIG. 7 is a top view of a deformation control structure in a second mode according to an embodiment of the present disclosure. As shown in FIG. 6 and FIG. 7, when the deformable display device is switched from the first mode to the second mode, the moving portion 4 drives the first region 3 of the flexible display screen 1 to move relative to the reference point O2, so that the screen shape changes. However, when the shape of the screen changes, the length of the screen also changes. For example, when changing from a three-dimensional annular screen to a three-dimensional triangular screen, a larger screen length is required to match the triangular shape. Therefore, while the moving portion 4 drives the flexible display screen 1 to deform, the rolling control portion 5 also synchronously controls the flexible display screen 1 to wind and unwind, so that the length of the screen after winding and unwinding is a length required by the current shape. On the one hand, when the required screen length is longer, the synchronous winding can prevent the screen from being damaged. On the other hand, when the required screen length is shorter, the synchronous winding back can keep the screen always maintain a flat state to improve the display effect.

In an embodiment, with reference to FIG. 6 and FIG. 7, the moving portion 4 includes a sliding rod 6 and a sliding control part 7. When the deformable display device is switched from the first mode to the second mode, the sliding control part 7 controls the sliding rod 6 to slide, so that the sliding rod 6 drives the first region 3 of the flexible display screen 1 to move relative to the reference point O2, so as to control the change of the distance between the first point O1 and the reference point O2, and control the screen of the flexible display screen 1 to switch between different shapes.

Figure 8:
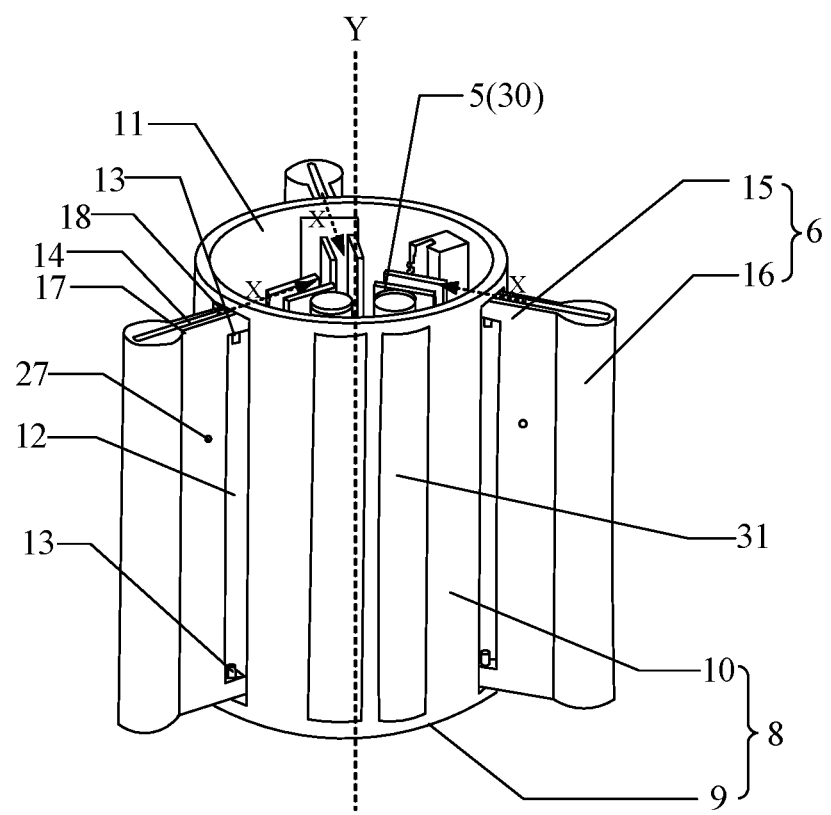
FIG. 8 is a schematic diagram of a base according to an embodiment of the present disclosure.
Figure 9:
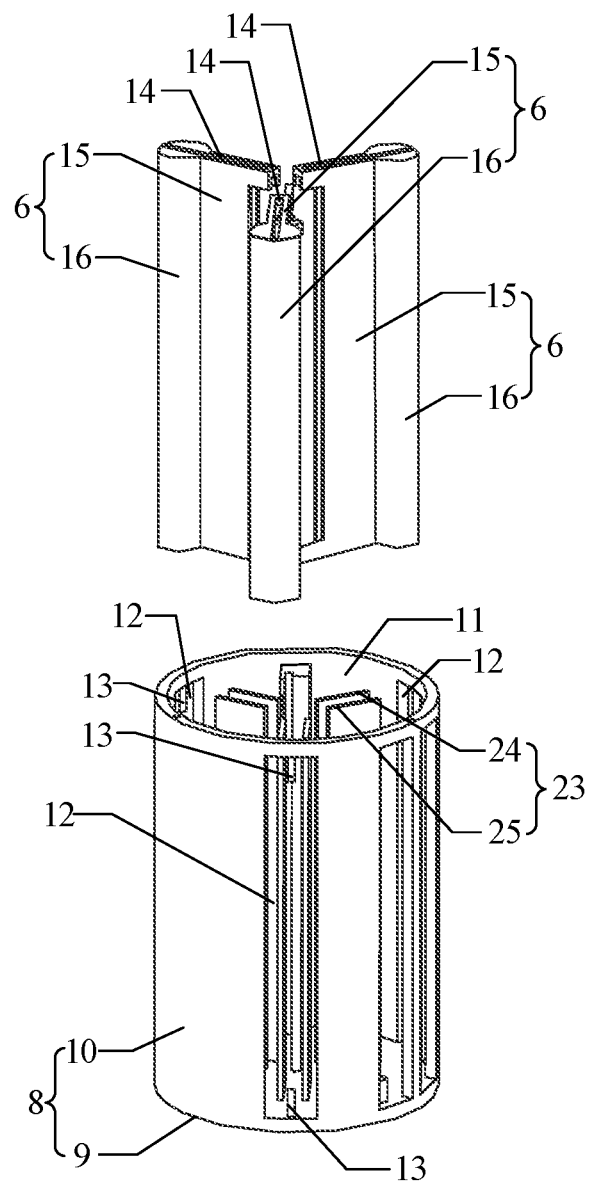
FIG. 9 is an exploded schematic diagram of a deformation control structure according to an embodiment of the present disclosure in a first mode.
Figure 10:
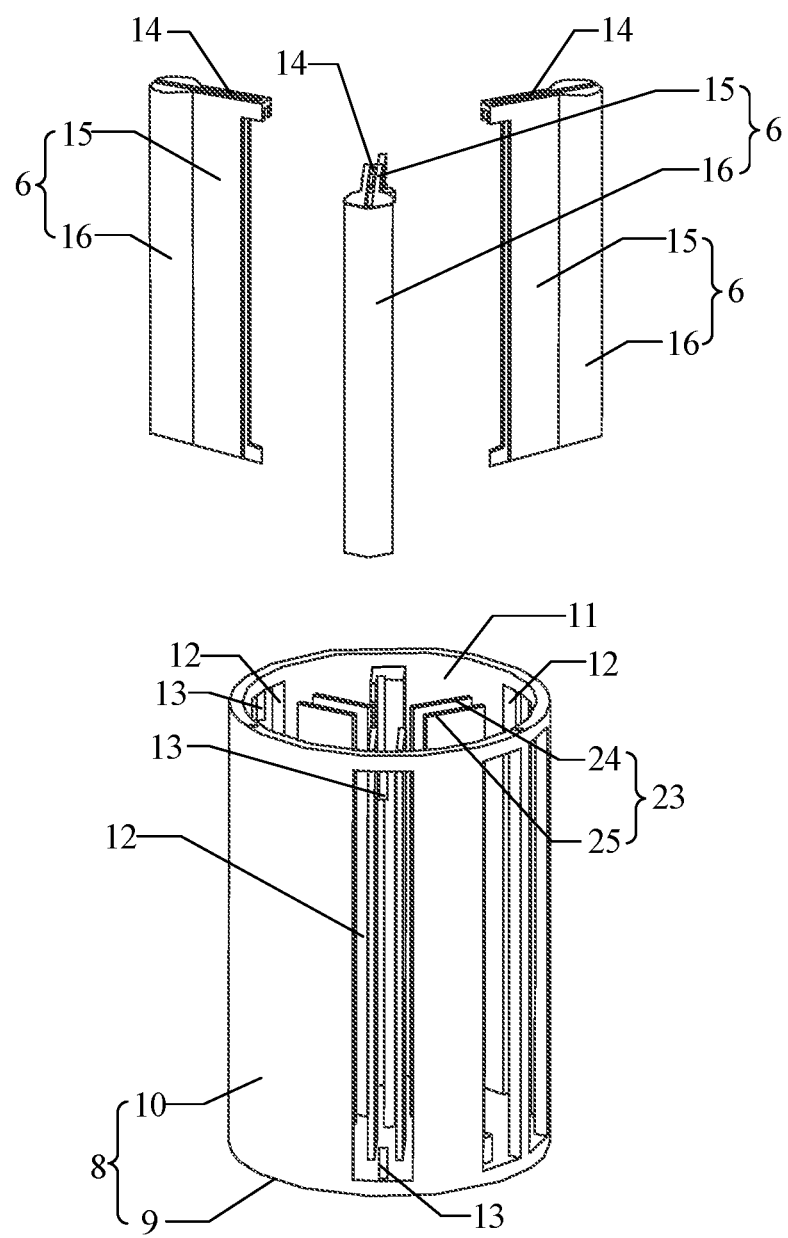
FIG. 10 is an exploded schematic diagram of a deformation control structure according to an embodiment of the present disclosure in a second mode.

FIG. 8 is a schematic diagram of a base according to an embodiment of the present disclosure, FIG. 9 is an exploded schematic diagram of a deformation control structure in a first mode according to an embodiment of the present disclosure. FIG. 10 is an exploded schematic diagram of a deformation control structure in a second mode according to embodiments of the present disclosure. With reference to FIG. 6 to FIG. 10, the deformation control structure 2 also includes a base 8. The base 8 includes a bottom wall 9 and a side wall 10 intersecting the bottom wall 9. The side wall 10 is wound to form an accommodating cavity 11. At least a part of the flexible display screen 1 is located at a side of the side wall 10 facing away from the accommodating cavity 11, and a first opening 12 is provided on the side wall 10. When the deformable display device is switched from the first mode to the second mode, the sliding rod 6 passes through the first opening 12 when sliding, and after the sliding rod 6 passes through the first opening 12, an end of the sliding rod 6 abuts against the flexible display screen 1 and drives the flexible display screen 1 to change the shape of the screen of the flexible display screen 1.

Since the side wall 10 of the base 8 can be wound to form the accommodating cavity 11, in the first mode, the flexible display screen 1 can be supported by the side wall 10 of the base 8 to form a three-dimensional annular screen. In this way, the flexible display screen 1 can meet the requirement of 360° viewing angle, and have a wider range of a radiation viewing angle.

Since the position of the side wall 10 is fixed, the position of the side wall 10 remains unchanged when the deformable display device switches between different modes. Therefore, the reference point O2 can be selected as a point on the side wall 10.

In an embodiment, with reference to FIG. 8, the base 8 includes a limit post 13 at the first opening 12, the sliding rod 6 includes a sliding groove 14, and the sliding groove 14 is slidably connected to the limit post 13.

Two limit posts 13 can be provided at one first opening 12 and respectively located on an upper side and a lower side of the first opening 12. For example, one limit post 13 is located on a side of the first opening 13 away from the bottom wall 9 and protrudes towards the bottom wall 9, and the other limit post 13 is located on a side of the first opening 13 close to the bottom wall 9 and protrudes away from the bottom wall 9. When the sliding rod 6 is slidably connected to the base 8, the limit post 13 is disposed in the sliding groove 14. When the sliding rod 6 slides, the sliding groove 14 slides along with the sliding rod 6, and the limit post 13 is always disposed in a track of the sliding groove 14. Since the position of the limit post 13 is fixed, the limit post 13 can limit a maximum sliding distance of the sliding rod 6 to achieve effective control of the screen shape of the flexible display screen 1.

In an embodiment, with reference to FIG. 7 again, the sliding rod 6 includes a rod main body 15 and a rod end 16 that communicate with each other. When the sliding rod 6 slides, the rod end 16 contacts the flexible display screen 1, and a surface of the rod end 16 in contact with the flexible display screen 1 is an arc surface. With such configuration, when the sliding rod 6 slides outward to apply a stress to the flexible display screen 1 to pull the screen outward, it can be avoided that the stress applied on the part of the flexible display screen 1 in contact with the sliding rod 6 concentrates, which reduces the risk of the flexible display screen 1 being damaged by the sliding rod 6, and prolongs the service life of the flexible display screen 1.

In an embodiment, with reference to FIG. 8 again, the sliding rod 6 includes a rod main body 15 and a rod end 16, the rod main body 15 includes a first end part 17 and a second end part 18, and the first end part 17 communicates with the rod end 16, a direction from the first end part 17 to the second end part 18 is a first direction x. The moving portion 4 includes a plurality of sliding rods 6, and the first directions of the plurality of sliding rods 6 point to a central axis Y of the accommodating cavity 11. At this time, the rod ends 16 of the multiple sliding rods 6 diverge around. After the multiple sliding rods 6 slide to drive the flexible display screen 1 to deform, the deformed screen shape is more suitable for viewers to watch at a viewing angle of 360°.

In conjunction with FIG. 8, with reference to FIG. 6 and FIG. 7 again, limit parts 23 are provided in the accommodating cavity 11 and include at least a first limit part 24 and a second limit part 25. When the deformable display device is switched from the first mode to the second mode, the sliding rod 6 passes through a gap formed between the first limit part 24 and the second limit part 25 when sliding.

For example, the limit parts 23 correspond to the sliding rods 6 in one-to-one correspondence, and the first limit part 24 and the second limit part 25 of the limit parts 23 are respectively located at two sides of the rod main body 15 of a corresponding sliding rod 6. When the sliding rod 6 slides, the first limit part 24 and the second limit part 25 can limit a sliding track of the sliding rod 6 to ensure that the sliding rod 6 slides along a predetermined track, thereby achieving effective control of the screen shape.

In order to further improve the limiting effect of the limit parts on the sliding track of the sliding rod 6, the first limit part 24 and the second limit part 25 each can be a plate-like structure. A length of the first limit part 24 in a direction perpendicular to the bottom wall 9 and a length of the second limit part 25 in the direction perpendicular to the bottom wall 9 each are greater than or equal to a height of the rod main body 15 in the direction perpendicular to the bottom wall 9.

When the deformable display device is switched from the first mode to the second mode, the positions of the first limit part 24 and the second limit part 25 can remain unchanged. As a result, the reference point O2 can also be a point on the part 24 or a point on the second limit part 25.

Figure 11:
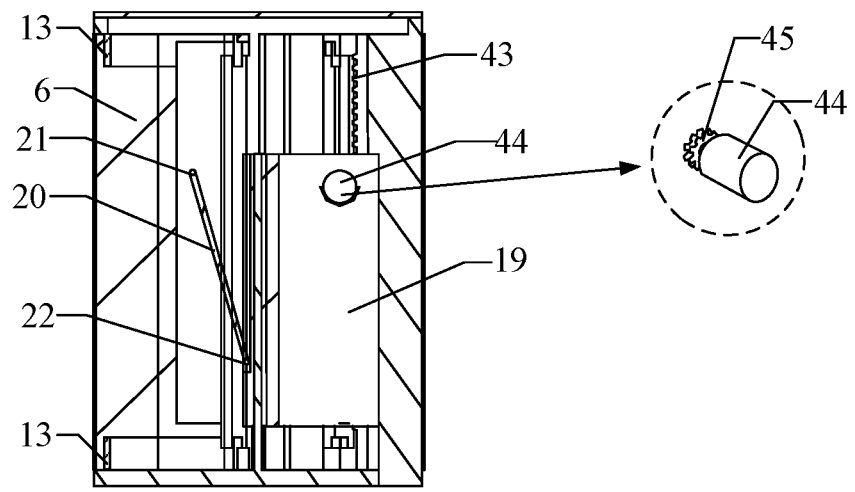
FIG. 11 is a cross-sectional view along A1-A2 shown in FIG. 6.
Figure 12:
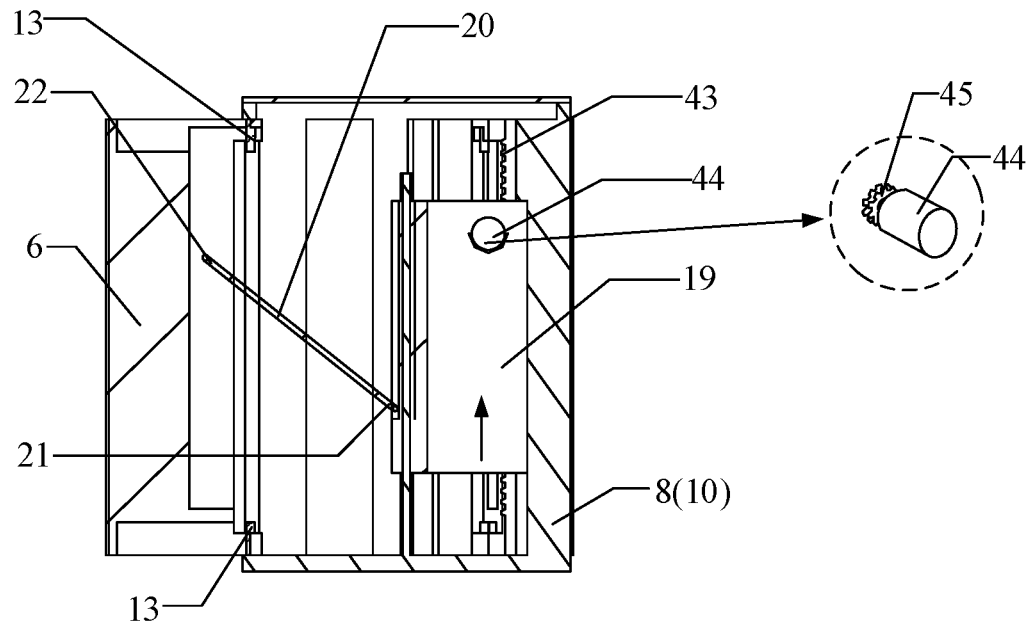
FIG. 12 is a cross-sectional view along B1-B2 shown in FIG. 7.

FIG. 11 is a cross-sectional view along A1-A2 shown in FIG. 6, and FIG. 12 is a cross-sectional view along B1-B2 shown in FIG. 7. In an embodiment, in conjunction with FIG. 6 and FIG. 7, as shown in FIG. 11 and FIG. 12, the sliding control part 7 includes a lifting rod 19 and a connecting rod 20. A first end 21 of the connecting rod 20 is connected to the lifting rod 19, and a second end 22 of the connecting rod 20 is connected to the sliding rod 6. The lifting rod 19 lifts to drive the connecting rod 20 to rotate in such a manner that the connecting rod 20 rotates to drive the sliding rod 6 to slide.

For example, when the deformable display device switches from the first mode to the second mode, the lifting rod 19 raises, and the first end 21 of the connecting rod 20 also raises accordingly. At this time, the connecting rod 20 rotates to drive the sliding rod 6 to slide outwards. When the sliding rod 6 slides out of the first opening 12, the sliding rod 6 contacts the flexible display screen 1 to drive the screen of the flexible display screen 1 to deform.

In an embodiment, in conjunction with FIG. 6 to FIG. 8, FIG. 11, and FIG. 12, the deformation control structure 2 further includes a base 8. The base 8 includes a bottom wall 9 and a side wall 10 intersecting the bottom wall 9. The side wall 10 is wound to form an accommodating cavity 11, at least a part of the flexible display screen 1 is located at a side of the side wall 10 facing away from the accommodating cavity 11, and the lifting rod 19 is located in the accommodating cavity 11. Meshing teeth 43 are provided on a side of the side wall 10 facing towards the accommodating cavity 11 and extend along a lifting direction of the lifting rod 19. The sliding control part 7 further includes a first motor 44 fixed on the lifting rod 19. The first motor 44 includes a gear 45, and the first motor 44 is configured to drive the lifting rod 19 to lift through meshing between the gear 45 and the meshing teeth 43.

The first motor 44 can be fixed on the lifting rod 19 by limiting and pasting. The gear 45 at a front end of the first motor 44 and the meshing teeth 43 located on an inner side of the side wall 10 realize the meshing of the gear 45. When the first motor 44 is working, the meshing between the gear 45 and the meshing teeth 43 drives an elevator to move up and down.

Figure 13:
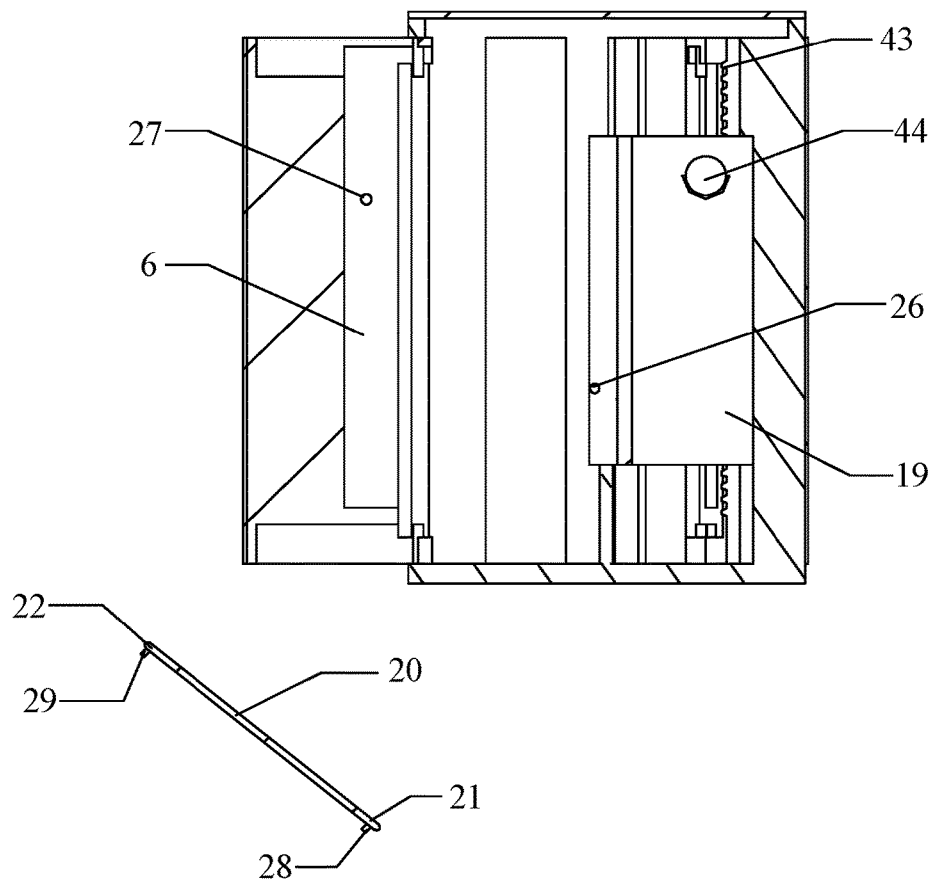
FIG. 13 is a schematic diagram illustrating a positioning hole and a positioning post according to an embodiment of the present disclosure.

FIG. 13 is a schematic diagram illustrating a positioning hole and a positioning post provided by an embodiment of the present disclosure. In conjunction with FIG. 11 and FIG. 12, as shown in FIG. 13, a first positioning hole 26 is provided on the lifting rod 19, and a second positioning hole 27 is provided on the sliding rod 6. A first positioning post 28 fixedly connected to the first positioning hole 26 is provided on the first end 21 of the connecting rod 20, and a second positioning column 29 fixedly connected to the second positioning hole 27 is provided on the second end 22 of the connecting rod 20.

The first positioning post 28 can be inserted into the first positioning hole 26 to be fixedly connected to the first positioning hole 26, and the second positioning post 29 can be inserted into the second positioning hole 27 to be fixedly connected to the second positioning hole 27. At this time, the connection between the connecting rod 20 and the lifting rod 19 and the connection between the connecting rod 20 and the sliding rod 6 have high reliability. During a lifting process of the elevator, it is not easy for the connecting rod 20 to fall off from the lifting rod 19 and the sliding rod 6, improving the reliability of sliding of the sliding rod 6 driven by the connecting rod 20.

In an embodiment, referring to FIG. 6 and FIG. 7 again, the deformation control structure 2 includes a plurality of sliding rods 6, and the sliding control part 7 includes a lifting rod 19 and a plurality of connecting rods corresponding to the plurality of sliding rods 6 in one-to-one correspondence. The plurality of connecting rods 20 is connected to the lifting rod 19, and each of the plurality of connecting rods 20 is also connected to a corresponding sliding rod 6. In this case, the plurality of sliding rods 6 can be controlled to slide by only one lifting rod 19, which makes the control method simple and convenient, and reduces the structural complexity of the deformation control structure 2.

In embodiments of the present disclosure, the length of the connecting rod 20 corresponding to each sliding rod 6, which is a position where the connecting rod 20 is connected to the lifting rod 19, and a position where the connecting rod 20 is connected to the sliding rod 6 can be designed as the same or different according to actual needs, so as to achieve the same or different control of the sliding distances of the plurality of sliding rods 6.

For example, in an embodiment, the lengths of the connecting rods 20 are equal to each other, and the positions of the second positioning holes 27 on the sliding rods 6 are the same. At this time, when the lifting rods 19 are lifted, the connecting rods 20 rotate with a same angle to control the plurality of sliding rods 6 to slide a same distance. Such configuration is more suitable for controlling the flexible display screen 1 to form a three-dimensional regular polygon shape.

Figure 14:
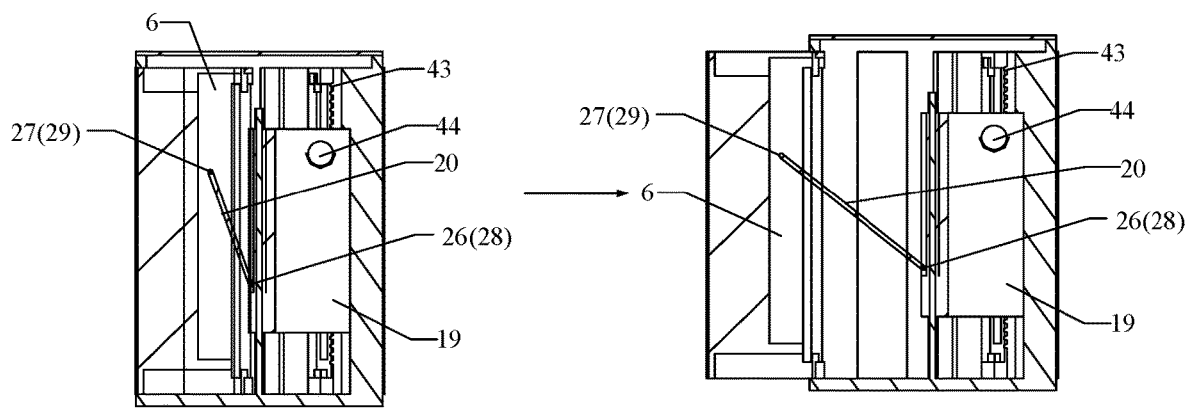
FIG. 14 is a schematic diagram illustrating a sliding distance of a sliding rod according to an embodiment of the present disclosure.
Figure 15:
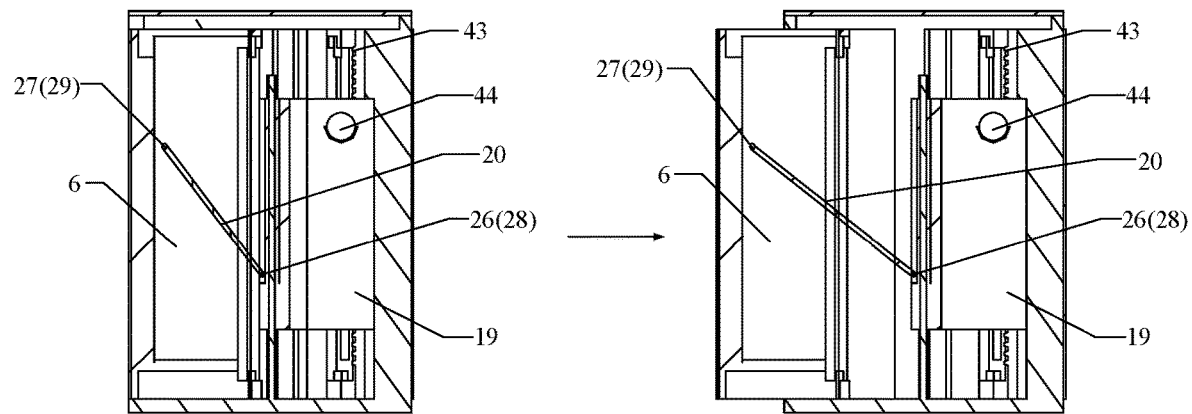
FIG. 15 is another schematic diagram illustrating a sliding distance of a sliding rod according to an embodiment of the present disclosure.

In another embodiment, the connecting rods 20 have a same length, the second positioning hole 27 of a first one of the sliding rods 6 is located on a side of the first one of the sliding rods 6 close to one lifting rod 19, and another second positioning hole 27 of a second one of the sliding rods 6 is located on a side of the second one of the sliding rods 6 far away from another lifting rod 19. As shown in FIG. 14 that is a schematic diagram illustrating a sliding distance of the sliding rod according to an embodiment of the present disclosure, when the lifting rods 19 are lifted with a same distance, for the first one of the sliding rods 6 having a second positioning hole 27 close to the one lifting rod 19, the connecting rod 20 corresponding to the first one of the sliding rods 6 rotates with a larger angle, so this connecting rod 20 drives the first one of the sliding rods 6 to slide outward with a larger distance. As shown in FIG. 15 that is another schematic diagram illustrating a sliding distance of the sliding rod according to an embodiment of the present disclosure, as for the second one of the sliding rods 6 having a second positioning hole 27 far away from another lifting rod 19, the connecting rod 20 corresponding to the second one of the sliding rods 6 that rotates with a smaller angle, so this connecting rod 20 drives the second one of the sliding rods 6 to slide outward with a smaller distance, which is more suitable for controlling the flexible display 1 to form an irregular polygonal shape.

Figure 16:
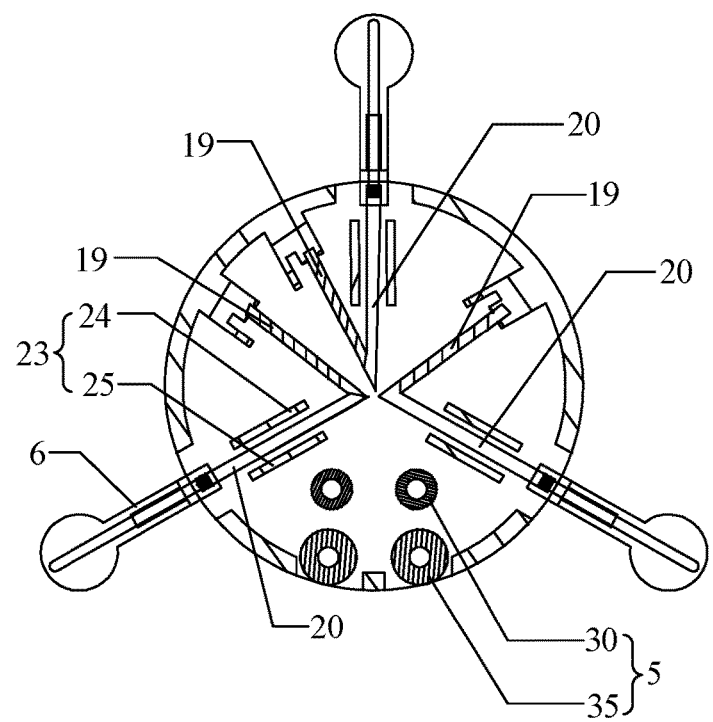
FIG. 16 is a schematic diagram of a sliding control part according to an embodiment of the present disclosure.

FIG. 16 is another schematic diagram of a sliding control part according to an embodiment of the present disclosure. In an embodiment, as shown in FIG. 16, the deformation control structure 2 includes a plurality of sliding rods 6, and the sliding control part 7 includes a plurality of lifting rods 19 corresponding to the plurality of sliding rods 6 in one-to-one correspondence and a plurality of connecting rods 20 corresponding to the plurality of sliding rods 6 in one-to-one correspondence. Each of the plurality of connecting rods 20 is connected to a corresponding one of the plurality of lifting rods 19 and a corresponding one of the plurality of sliding rods 6.

Figure 17:
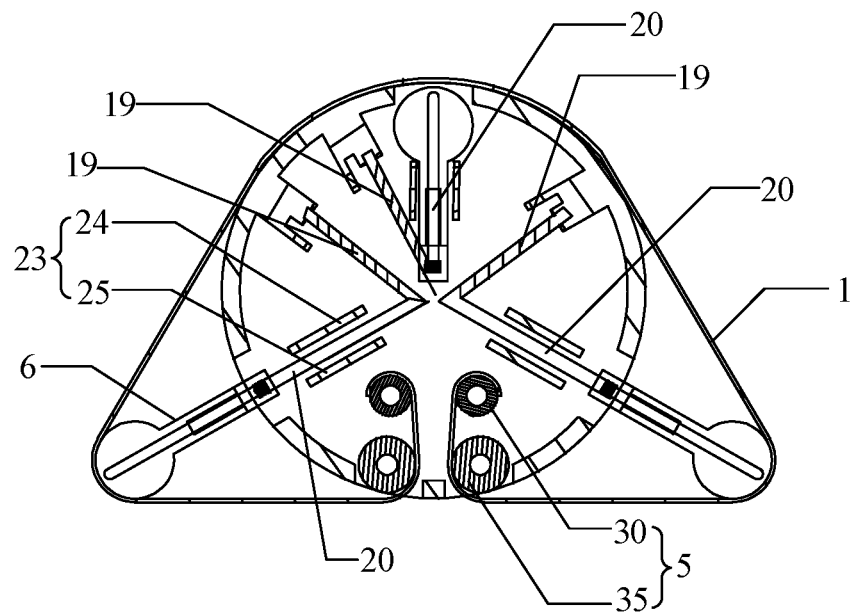
FIG. 17 is a schematic diagram illustrating sliding of a plurality of sliding rods according to an embodiment of the present disclosure.

In this case, each sliding rod 6 is controlled by an independent lifting rod 19 and an independent connecting rod 20. With such configuration, the sliding of the sliding rod 6 is controlled more flexibly. FIG. 17 is a schematic diagram illustrating sliding of a plurality of sliding rods shown according to an embodiment of the present disclosure. For example, as shown in FIG. 17, some of the sliding rods 6 can be controlled to slide while the remaining sliding rods 6 do not slide. In an embodiment, it is also achieved that some sliding rods 6 slide a larger distance while other sliding rods 6 slide a shorter distance.

With such configuration, different sliding rods 6 are controlled to slide independently. Even if one of the lifting rods 19 cannot be lifted normally, the sliding of the remaining sliding rods 6 can also be controlled by the remaining lifting rods 19. The screen shape of the flexible display screen 1 can still be changed to realize the deformation of the screen.

In an embodiment, with reference to FIG. 6 and FIG. 7 again, the rolling control portion 5 includes at least one fixed shaft 30 on which at least one end of the flexible display screen 1 is wound. When the deformable display device is switched from the first mode to the second mode, the fixed shaft 30 rotates to control the flexible display 1 to wind or unwind, so that the length of the screen after winding or unwinding matches the length of the screen required by the current shape. On the one hand, when the required screen length is longer, the screen can be wound synchronously to prevent the screen from being torn. On the other hand, when the required screen length is short, the screen can be maintained in a flat state by synchronously winding back to improve the display effect.

Figure 18:
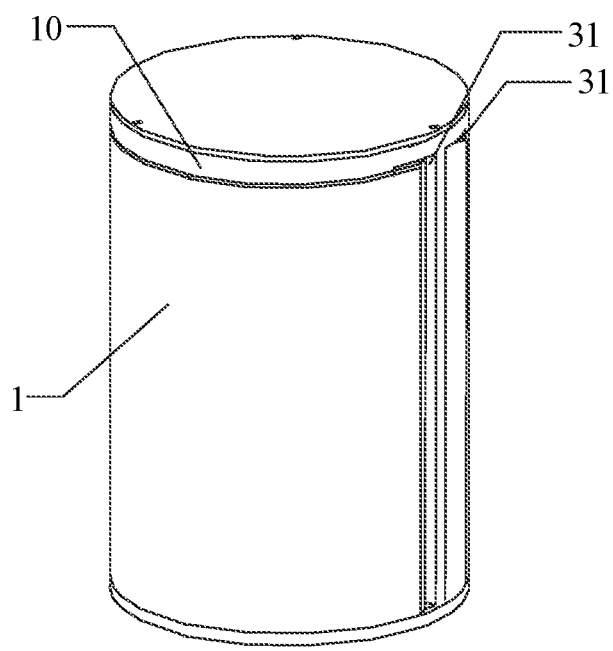
FIG. 18 is a schematic diagram illustrating the flexible display screen passing through a second opening in a first mode of the deformable display device according to an embodiment of the present disclosure.
Figure 19:
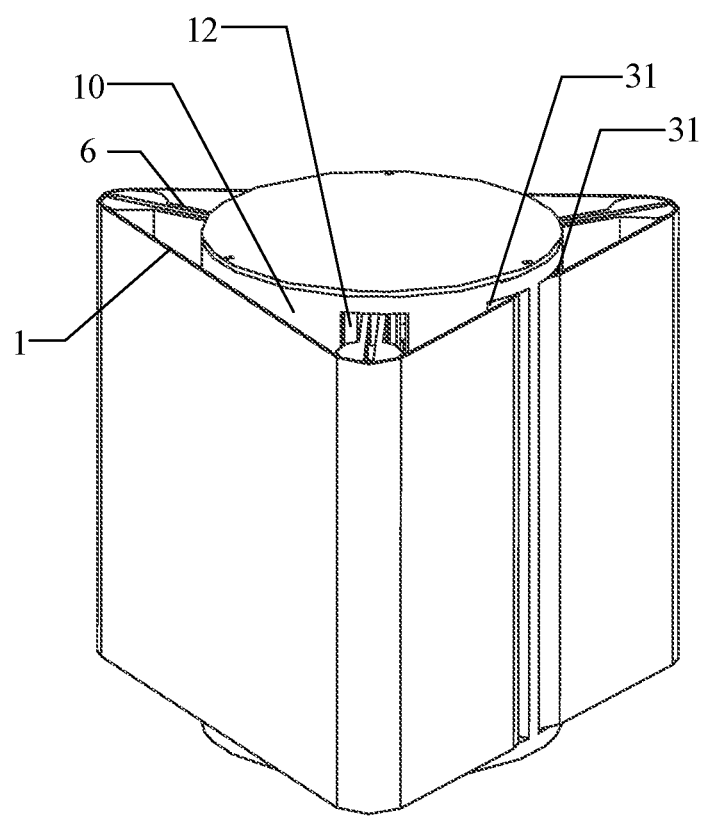
FIG. 19 is a schematic diagram illustrating the flexible display screen passing through a second opening in a second mode of the deformable display device according to an embodiment of the present disclosure.

FIG. 18 is a schematic diagram illustrating that a flexible display screen passes through a second opening in a first mode of a deformable display device according to an embodiment of the present disclosure. FIG. 19 is a schematic diagram illustrating that a flexible display screen passes through a second opening in a second mode of a deformable display device according to an embodiment of the present disclosure. In conjunction with FIG. 6 to FIG. 8, as shown in FIG. 18 and FIG. 19, the deformation control structure 2 further includes a base 8. The base 8 includes a bottom wall 9 and a side wall 10 intersecting the bottom wall 9, the side wall 10 is wound to form an accommodating cavity 11, and the flexible display screen 1 is partially located at a side of the side wall 10 facing away from the accommodating cavity 11. A second opening 31 is provided on the side wall 10, the fixed shaft 30 is located in the accommodating cavity 11, and the flexible display screen 1 passes through the second opening 31 to be connected to the fixed shaft 30.

With such configuration, the fixed shaft 30 is arranged in the accommodating cavity 11. On the one hand, the various components of the deformation control structure 2 are arranged more compactly, which improves the space utilization rate and reduces the volume of the deformation control structure 2. On the other hand, the fixed shaft 30 does not occupy the space outside the base 8 and therefore the fixed shaft 30 does not affect the shape of the flexible display screen 1. For example, if the fixed shaft 30 is located outside the base 8, in the first mode, a part of the flexible display screen 1 form a protrusion at the fixed shaft 30, which affects the display effect of the annular screen. With a configuration where the fixed shaft 30 is arranged in the accommodating cavity 11, in the first mode, the flexible display screen 1 is only supported by the side wall 10 of the base 8, and the formed screen shape tends to be a standard annular shape.

Figure 20:
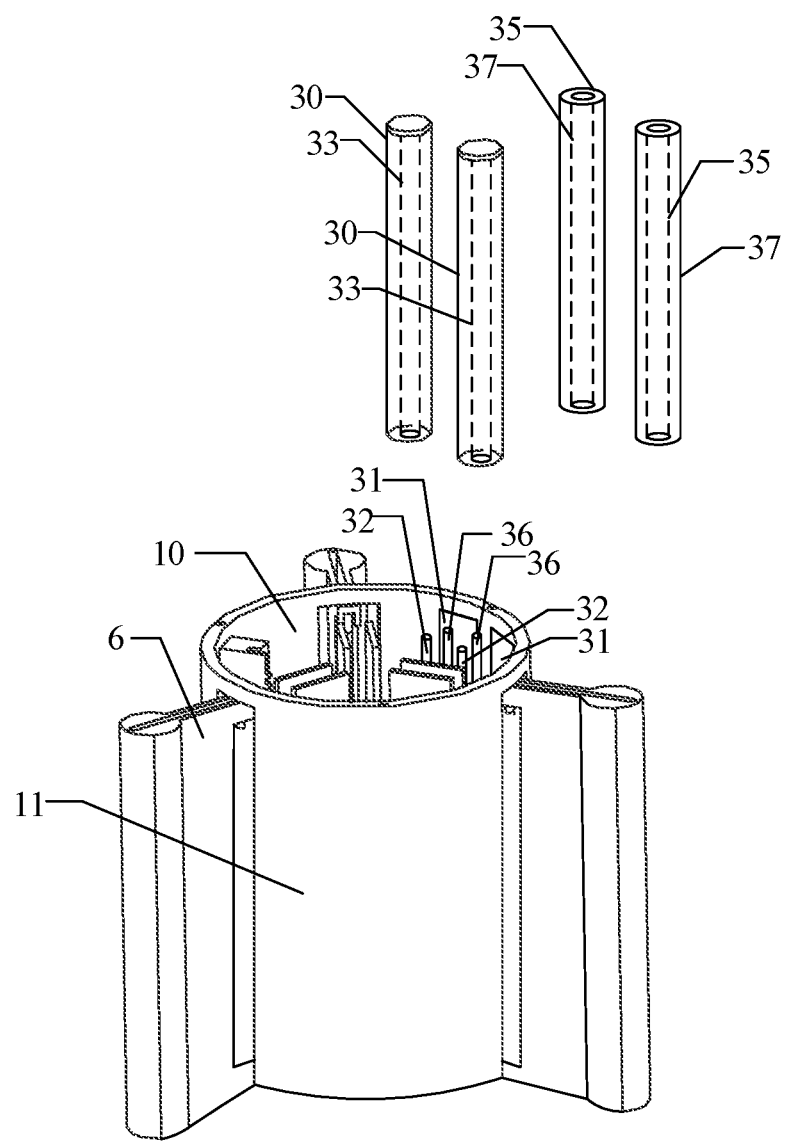
FIG. 20 is a schematic diagram of a fixed shaft according to an embodiment of the present disclosure.

FIG. 20 is a schematic diagram of a fixed shaft according to an embodiment of the present disclosure. In an embodiment, as shown in FIG. 20, a third positioning post 32 is provided on the bottom wall 9, the fixed shaft 30 includes a third positioning hole 33, and the third positioning post 32 is sleeved in the third positioning hole 33, which realizes the fixation between the fixed shaft 30 and the base 8 to prevent the fixed shaft 30 from shifting when controlling the flexible display screen 1 to wind and unwind, thereby improving the reliability of the screen when winding and unwinding.

In an embodiment, referring to FIG. 6 and FIG. 7 again, the rolling control portion 5 includes two fixed shafts 30 on which two ends of the flexible display screen 1 are respectively wound. In this way, the flexible display screen 1 are wound and unwound faster, which reduces the time required for the deformation of the flexible display 1 and thus improves the efficiency of screen deformation.

Figure 21:
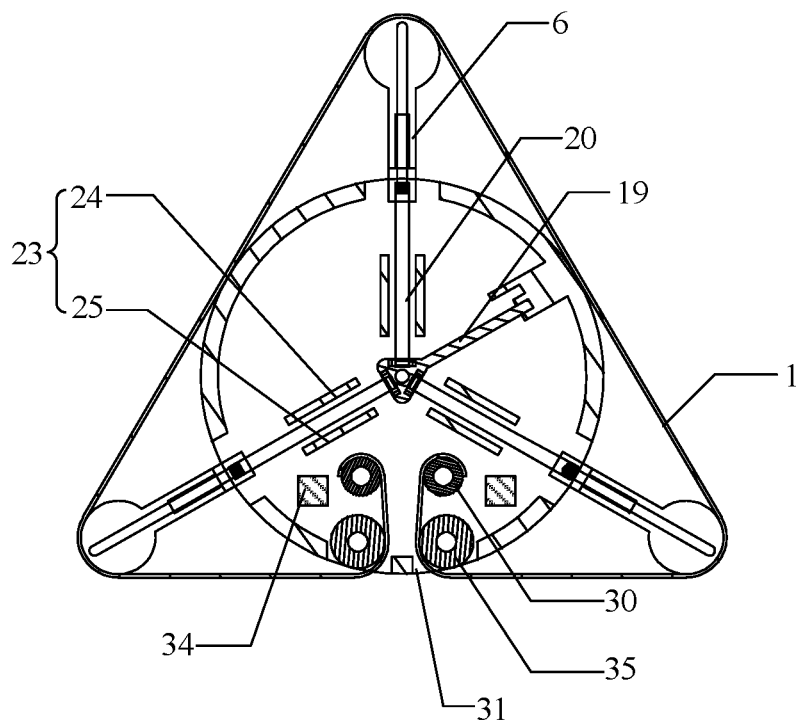
FIG. 21 is a schematic diagram of a second motor according to an embodiment of the present disclosure.

FIG. 21 is a schematic diagram of a second motor according to an embodiment of the present disclosure. In an embodiment, as shown in FIG. 21, the rolling control portion 5 further includes a second motor 34, and the second motor 34 is configured to control the fixed shaft 30 rotation, so that the fixed shaft 30 controls the flexible display screen 1 to wind back.

For example, when the deformable display device is switched from the second mode to the first mode, the sliding rod 6 slides into the accommodating cavity 11, and at the same time, the second motor 34 operates to control the fixed shaft 30 to rotate to wind the flexible display screen 1 back, so that the screen shape of the flexible display screen 1 is controlled to be changed.

When controlling the flexible display screen 1 to wind, the sliding rod 6 applies a force on the flexible display screen 1 to push the flexible display screen 1 outward, so that the flexible display screen 1 drives the fixed shaft 30 to rotate, thereby realizing winding. In another embodiment, the second motor 34 can control the fixed shaft 30 to rotate to realize winding. When the second electrode controls the fixed shaft 30 to rotate to realize winding, the flexible display screen 1 bears a small external force, which reduces the risk of damaging the screen.

In an embodiment, with reference to FIG. 6 and FIG. 7 again, the rolling control portion 5 further includes a rotating shaft 35, the side wall 10 includes a first surface 41 and a second surface 42 that form the second opening. The first surface 41 and the second surface 42 are opposite to each other. The rotating shaft 35 is located between the first surface 41 and the second surface 42, and the rotating shaft 35 supports the flexible display screen 1. In other words, the rotating shaft 35 is located in the second opening, and the flexible display screen 1 bypasses a surface of the rotating shaft 35 and then is connected to the fixed shaft 30.

With the rotating shaft 35, the flexible display screen 1 bypasses the surface of the rotating shaft 35 when passing through the second opening 31. Since the rotating shaft 35 has an arc surface, it is avoided that the flexible display screen 1 is bent with a small angle at the first surface 41 or the second surface 42, which, in turn, reduces the risk of damaging the flexible display screen 1 when the flexible display screen 1 is wound or unwound.

In an embodiment, referring to FIG. 20 again, the bottom wall 9 is provided with a fourth positioning post 36, and the rotating shaft 35 includes a fourth positioning hole 37. The fourth positioning post 36 is sleeved in the fourth positioning hole 37 to realize the fixation between the rotating shaft 35 and the base 8 to prevent a position of the rotating shaft 35 from shifting when the flexible display screen 1 is wound or unwound.

When the mode of the deformable display device is switched, the positions of the third positioning post 32 and the fourth positioning post 36 remain unchanged. Therefore, the reference point O2 can be a point on the third positioning column 32 or a point on the fourth positioning column 36, for example a point on a central axis of the third positioning post 32 or a point on a central axis of the fourth positioning post 36.

Figure 22:
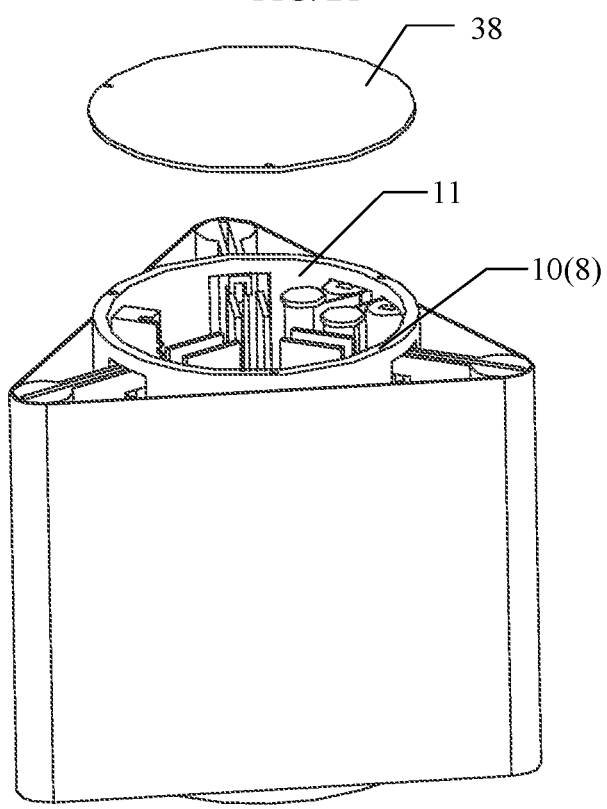
FIG. 22 is a schematic diagram of an upper cover according to an embodiment of the present disclosure.

FIG. 22 is a schematic diagram of an upper cover according to an embodiment of the present disclosure. In an embodiment, as shown in FIG. 22, the deformation control structure 2 further includes an upper cover 38 covering the base 8 and covering the accommodating cavity 11. With the upper cover 38, impurities can be prevented by the upper cover 38 from entering the accommodating cavity 11, which achieves a dust-proof function, thereby preventing impurities from affecting the performance of various components in the accommodating cavity 11 and improving the operating reliability of the deformation control structure 2.

In an embodiment, with reference to FIG. 8 again, the base 8 can be a cylindrical structure. When the sliding rod 6 is located in the accommodating cavity 11, the side wall 10 of the base 8 supports the flexible display screen 1 so that the flexible display screen 1 is in a three-dimensional annular shape, which makes the deformable display device more suitable for application scenarios with a viewing angle of 360°.

Figure 23:
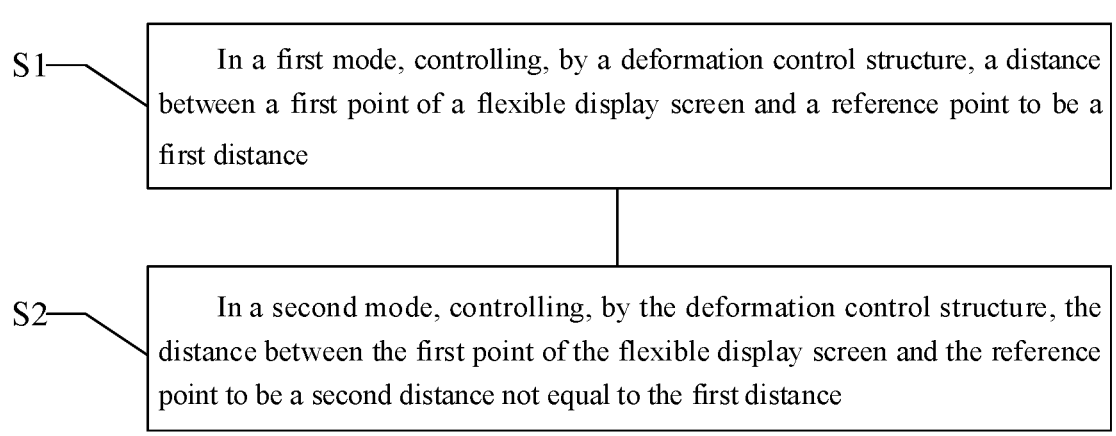
FIG. 23 is a flowchart of a deformation control method according to an embodiment of the present disclosure.

Based on the same concept, an embodiment of the present disclosure also provides a deformation control method for a deformable display device. The deformation control method is applied to the above deformable display device. FIG. 23 is a flow chart of a deformation control method according to an embodiment. The deformation control method includes steps S1 and S2.

At S1, in the first mode, the deformation control structure 2 controls the distance between the first point O1 of the flexible display screen 1 and the reference point O2 to be the first distance.

At S2, in the second mode, the deformation control structure 2 controls the distance between the first point O1 of the flexible display screen 1 and the reference point O2 to be the second distance different from the first distance.

The reference point O2 is a point on the deformation control structure 2. When the deformable display device is switched from the first mode to the second mode, the position of the reference point O2 remains unchanged, and the display surface, on which the first point O1 is located, of the flexible display screen 1 intersects the line connecting the first point O1 with the reference point O2.

In embodiments of the present disclosure, the deformation control structure 2 drives the flexible display screen 1 to change the distance between the first point O1 and the reference point O2, so that the flexible display screen 1 can be switched between different shapes. For example, the deformation control structure 2 can drive the flexible display screen 1 to be switched from the three-dimensional annular screen shown in FIG. 1 to the three-dimensional triangular screen shown in FIG. 2. As a result, the deformation of the flexible display screen 1 is no longer limited to the screen shape that can be achieved by its own bending and folding, but the flexible display screen 1 can have a variety of deformations under the control of the deformation control structure 2. The deformed screen shape can satisfy a larger viewing angle requirements, such as meeting requirements of the viewing angle of 360°, and the deformable display device can be applied to more application scenarios, which brings a better viewing experience to viewers.

In an embodiment, with reference to FIG. 5 to FIG. 7, the flexible display screen 1 includes a first region 3 where the first point O1 is located, and the deformation control structure 2 includes a moving portion 4 and a rolling control portion 5. When the deformable display device is switched from the first mode to the second mode, the moving portion 4 drives the first region 3 of the flexible display screen 1 to move relative to the reference point O2 while the rolling control portion 5 controls the flexible display screen 1 to wind or unwind.

When the deformable display device switches from the first mode to the second mode, the moving portion 4 drives the first region 3 of the flexible display screen 1 to move relative to the reference point O2, so that the screen shape is changed. However, when the shape of the screen changes, the required length of the screen also changes. For example, when changing from a three-dimensional annular screen to a three-dimensional triangular screen, a larger screen length is required to match the triangular shape. Therefore, while the moving portion 4 drives the flexible display screen 1 to deform, the rolling control portion 5 also synchronously controls the flexible display screen 1 to wind and unwind, so that the length of the screen after winding and unwinding is as required by the current shape. On the one hand, when the required screen length is longer, synchronously winding can prevent the screen from being torn. On the other hand, when the required screen length is short, the synchronously winding back can keep the screen always maintain a flat state to improve the display effect.

The above are merely some embodiments of the present disclosure, which, as mentioned above, are not intended to limit the present disclosure. Within the principles of the present disclosure, any modification, equivalent substitution, improvement shall fall into the protection scope of the present disclosure.

Finally, it should be noted that the technical solutions of the present disclosure are illustrated by the above embodiments, but not intended to limit thereto. Although the present disclosure has been described in detail with reference to the foregoing embodiments, those skilled in the art can understand that the present disclosure is not limited to the specific embodiments described herein, and can make various obvious modifications, readjustments, and substitutions without departing from the scope of the present disclosure.

What is claimed is:

1. A deformable display device, comprising:
    a flexible display screen; and
    a deformation control structure configured to drive the flexible display screen to deform,
    wherein the deformable display device has a first mode and a second mode, and a first distance between a first point of the flexible display screen and a reference point in the first mode is not equal to a second distance between the first point of the flexible display screen and the reference point in the second mode;
    wherein the reference point is a point on the deformation control structure, a position of the reference point remains unchanged when the deformable display device is switched from the first mode to the second mode, and a display surface, on which the first point is located, of the flexible display screen intersects a connection line between the first point and the reference point;
    wherein the flexible display screen has a first region where the first point is located;
    wherein the deformation control structure comprises a moving portion and a rolling control portion, wherein when the deformable display device is switched from the first mode to the second mode, the moving portion drives the first region of the flexible display screen to move relative to the reference point, and the rolling control portion controls the flexible display screen to wind or unwind;
    wherein the moving portion comprises at least one sliding rod and a sliding control part, wherein when the deformable display device is switched from the first mode to the second mode, the sliding control part controls the at least one sliding rod to slide in such a manner that the at least one sliding rod drives the first region of the flexible display screen to move relative to the reference point;
    wherein the deformation control structure further comprises a base, wherein the base comprises a bottom wall and a side wall intersecting the bottom wall, the side wall is wound to form an accommodating cavity, and the flexible display screen is at least partially located at a side of the side wall facing away from the accommodating cavity, and at least one first opening is formed in the side wall; and
    when the deformable display device is switched from the first mode to the second mode, each of the at least one sliding rod passes through one of the at least one first opening when sliding.

2. The deformable display device of claim 1, wherein the base is provided with at least one limit post at the at least one first opening, each of the at least one sliding rod comprises a sliding groove, and the sliding groove is slidably connected to one of the at least one limit post.

3. The deformable display device of claim 1, wherein each of the at least one sliding rod comprises a rod main body and a rod end that are configured to communicate with each other, wherein when the at least one sliding rod slides, the rod end contacts the flexible display screen by an arc surface provided at the rod end.

4. The deformable display device of claim 1, wherein the at least one sliding rod comprises a plurality of sliding rods, wherein each of the plurality of sliding rods comprises a rod main body and a rod end, wherein the rod main body comprises a first end part and a second end part, and the first end part communicates with the rod end; and
    wherein a first direction is a direction from the first end part pointing to the second end part, and the first directions of the plurality of sliding rods each points to a central axis of the accommodating cavity.

5. The deformable display device of claim 1, wherein the accommodating cavity is provided with limit parts comprising a first limit part and a second limit part, and when the deformable display device is switched from the first mode to the second mode, one of the at least one sliding rod passes through a gap formed between the first limit part and the second limit part when sliding.

6. The deformable display device of claim 1, wherein the deformable display device is produced by
    a method comprising:
    in the first mode, controlling, by the deformation control structure, a distance between the first point of the flexible display screen and the reference point to be the first distance; and
    in the second mode, controlling, by the deformation control structure, the distance between the first point of the flexible display screen and the reference point to be the second distance not equal to the first distance.

7. The deformable display device of claim 1, wherein the sliding control part comprises at least one lifting rod and at least one connecting rod, wherein each of the at least one connecting rod comprises a first end connected to one of the at least one lifting rod and a second end connected to one of the at least one sliding rod, and each of the at least one at least one lifting rod is configured to lift to drive one connecting rod of the at least one connecting rod to rotate in such a manner that the one connecting rod drives the sliding rod to slide.

8. The deformable display device of claim 1, wherein the rolling control portion comprises at least one fixed shaft on which at least one end of the flexible display screen are wound; and when the deformable display device is switched from the first mode to the second mode, the at least one fixed shaft rotates to control the flexible display screen to wind or unwind.

9. A deformable display device, comprising:
a flexible display screen; and
a deformation control structure configured to drive the flexible display screen to deform,
wherein the deformable display device has a first mode and a second mode, and a first distance between a first point of the flexible display screen and a reference point in the first mode is not equal to a second distance between the first point of the flexible display screen and the reference point in the second mode;
wherein the reference point is a point on the deformation control structure, a position of the reference point remains unchanged when the deformable display device is switched from the first mode to the second mode, and a display surface, on which the first point is located, of the flexible display screen intersects a connection line between the first point and the reference point;
wherein the flexible display screen has a first region where the first point is located;
wherein the deformation control structure comprises a moving portion and a rolling control portion, wherein when the deformable display device is switched from the first mode to the second mode, the moving portion drives the first region of the flexible display screen to move relative to the reference point, and the rolling control portion controls the flexible display screen to wind or unwind;
wherein the moving portion comprises at least one sliding rod and a sliding control part, wherein when the deformable display device is switched from the first mode to the second mode, the sliding control part controls the at least one sliding rod to slide in such a manner that the at least one sliding rod drives the first region of the flexible display screen to move relative to the reference point; and
wherein the sliding control part comprises at least one lifting rod and at least one connecting rod, wherein each of the at least one connecting rod comprises a first end connected to one of the at least one lifting rod and a second end connected to one of the at least one sliding rod, and each of the at least one at least one lifting rod is configured to lift to drive one connecting rod of the at least one connecting rod to rotate in such a manner that the one connecting rod drives the sliding rod to slide.

10. The deformable display device of claim 9, wherein the deformation control structure further comprises a base, wherein the base comprises a bottom wall and a side wall intersecting the bottom wall, the side wall is wound to form an accommodating cavity, and the flexible display screen is at least partially located at a side of the side wall facing away from the accommodating cavity, the at least one lifting rod is located in the accommodating cavity, and meshing teeth are provided on a side of the side wall facing towards the accommodating cavity, and the meshing teeth extend along a lifting direction of the lifting rod; and
the sliding control part further comprises at least one first motor, each of the at least one first motor is fixed on one of the at least one lifting rod and comprises a gear, wherein each of the at least one first motor is configured to drive the at least one lifting rod to lift through meshing between the gear and the meshing teeth.

11. The deformable display device of claim 9, wherein each of the at least one lifting rod is provided with a first positioning hole, and each of the at least one sliding rod is provided with a second positioning hole;
each of the at least one connecting rod is provided with a first positioning post located at the first end of the connecting rod and fixedly connected to the first positioning hole, and a second positioning post located at the second end of the connecting rod and fixedly connected to the second positioning hole.

12. The deformable display device of claim 9, wherein the at least one sliding rod comprises a plurality of sliding rods, the at least one lifting rod comprises one lifting rod, the at least one connecting rod comprises a plurality of connecting rods corresponding to the plurality of sliding rods in one-to-one correspondence, and the plurality of connecting rods is connected to the one lifting rod, and each of the plurality of connecting rods is connected to a corresponding sliding rod of the plurality of sliding rods.

13. The deformable display device of claim 9, wherein the at least one sliding rod comprises a plurality of sliding rods, the at least one lifting rod comprises a plurality of lifting rods corresponding to the plurality of sliding rods in one-to-one correspondence, the at least one connecting rod comprises a plurality of connecting rods corresponding to the plurality of sliding rods in one-to-one correspondence, and each of the plurality of connecting rods is connected to both a corresponding lifting rod of the plurality of lifting rods and a corresponding sliding rod of the plurality of sliding rods.

14. A deformable display device, comprising:
a flexible display screen; and
a deformation control structure configured to drive the flexible display screen to deform,
wherein the deformable display device has a first mode and a second mode, and a first distance between a first point of the flexible display screen and a reference point in the first mode is not equal to a second distance between the first point of the flexible display screen and the reference point in the second mode;
wherein the reference point is a point on the deformation control structure, a position of the reference point remains unchanged when the deformable display device is switched from the first mode to the second mode, and a display surface, on which the first point is located, of the flexible display screen intersects a connection line between the first point and the reference point;
wherein the flexible display screen has a first region where the first point is located;
wherein the deformation control structure comprises a moving portion and a rolling control portion, wherein when the deformable display device is switched from the first mode to the second mode, the moving portion drives the first region of the flexible display screen to move relative to the reference point, and the rolling control portion controls the flexible display screen to wind or unwind; and
wherein the rolling control portion comprises at least one fixed shaft on which at least one end of the flexible display screen are wound; and when the deformable display device is switched from the first mode to the second mode, the at least one fixed shaft rotates to control the flexible display screen to wind or unwind.

15. The deformable display device of claim 14, wherein the deformation control structure further comprises a base, wherein the base comprises a bottom wall and a side wall intersecting the bottom wall, the side wall is wound to form an accommodating cavity, and the flexible display screen is at least partially located at a side of the side wall facing away from the accommodating cavity, and a second opening is formed in the side wall; and the at least one fixed shaft is located in the accommodating cavity, and the flexible display screen passes through the second opening to be connected to the at least one fixed shaft.

16. The deformable display device of claim 15, wherein at least one third positioning post is provided on the bottom wall, each of the at least one fixed shaft comprises a third positioning hole, and each of the at least one third positioning post is sleeved in the third positioning hole of one of the at least one fixed shaft.

17. The deformable display device of claim 14, wherein the at least one fixed shaft comprises two fixed shafts, and the at least one end of the flexible display screen comprises two ends of the flexible display screen that are respectively wound on the two fixed shafts, or wherein the rolling control portion further comprises at least one second motor, wherein each of the at least one second motor is configured to control one of the at least one fixed shaft to rotate in such a manner that the at least one fixed shaft controls the flexible display screen to wind.

18. The deformable display device of claim 15, wherein the rolling control portion further comprises a rotating shaft, the side wall comprises a first surface and a second surface that together form the second opening, the first surface and the second surface are opposite to each other, the rotating shaft is located between the first surface and the second surface, and the rotating shaft supports the flexible display screen.

19. The deformable display device of claim 18, wherein a fourth positioning post is provided on the bottom wall, the rotating shaft comprises a fourth positioning hole, and the fourth positioning post is sleeved in the fourth positioning hole.

* * * * *